United States Patent [19]
Suzuki

[11] Patent Number: 6,061,297
[45] Date of Patent: May 9, 2000

[54] SEMICONDUCTOR MEMORY DEVICE

[75] Inventor: Kouichi Suzuki, Kawasaki, Japan

[73] Assignee: NEC Corporation, Tokyo, Japan

[21] Appl. No.: 09/123,528

[22] Filed: Jul. 28, 1998

[30] Foreign Application Priority Data

Jul. 30, 1997 [JP] Japan .................................. 9-204907

[51] Int. Cl.[7] .................................. G11C 8/00; G11C 7/02
[52] U.S. Cl. ........................................ 365/238.5; 365/207
[58] Field of Search .................................. 365/205, 207, 365/208, 189.05, 230.08, 238.5; 327/51

[56] References Cited

U.S. PATENT DOCUMENTS

| | | | |
|---|---|---|---|
| 4,943,944 | 7/1990 | Sakui et al. | 365/189.05 |
| 5,293,332 | 3/1994 | Shirai | 365/205 |
| 5,319,253 | 6/1994 | You | 327/51 |
| 5,455,795 | 10/1995 | Nakao et al. | 365/189.05 |
| 5,483,498 | 1/1996 | Hotta | 365/233.5 |
| 5,500,819 | 3/1996 | Runas | 365/238.5 |
| 5,659,515 | 8/1997 | Matsuo et al. | 365/238.5 |
| 5,774,408 | 6/1998 | Shirley | 365/207 |
| 5,831,930 | 11/1998 | Hotta | 365/233.5 |

*Primary Examiner*—Trong Phan
*Attorney, Agent, or Firm*—McGinn & Gibb, P.C.

[57] ABSTRACT

A semiconductor memory device is provided which is capable of reducing the peak current of sense-amplifiers in the normal access mode operation and capable of a high speed access. The system comprises two types of sense-amplifiers 200 and 201 and a sense-amplifier control circuit for controlling activation start and finish time. Depending upon the access mode, the activation start time and the activation finish time for these sense-amplifiers and are shifted by a sense-amplifier control circuit, which can modify a one-shot-pulse signal generated by an ATD into an optional pulse width and a route for transmitting are altered for data obtained in the normal access mode operation and data obtained in the page access mode operation are transmitted by selected routes by a page-decoder, a sense-amplifier selection circuit, and a latch selector.

18 Claims, 16 Drawing Sheets

Fig. 3

| ACCESS MODE | | ADDRESS INPUT SIGNAL | | SENSE AMPLIFIER CONTROL SIGNAL | | | | | STATES OF SENSE AMPLIFIER CIRCUIT ○: ACTIVATED. ×: INACTIVATED | | | | | | | | |
|---|---|---|---|---|---|---|---|---|---|---|---|---|---|---|---|---|---|
| MODE | AREA | AD1 | AD0 | SAEBF0 | SAEBF1 | SAEBF2 | SAEBF3 | SAEB1 | SAF0 | SAF1 | SAF2 | SAF3 | SAL0 | SAL1 | SAL2 | SAL3 |
| STANDBY | tA1, tA4 | H/L | H/L | H | H | H | H | H | × | × | × | × | × | × | × | × |
| NORMAL | tA2 | L | L | L | H | H | H | L | ○ | × | × | × | ○ | ○ | ○ | ○ |
| | | L | H | H | L | H | H | L | × | ○ | × | × | ○ | ○ | ○ | ○ |
| | | H | L | H | H | L | H | L | × | × | ○ | × | ○ | ○ | ○ | ○ |
| | | H | H | H | H | H | L | L | × | × | × | ○ | ○ | ○ | ○ | ○ |
| PAGE | tA3 | H/L | H/L | H | H | H | H | H | × | × | × | × | × | × | × | × |

Fig. 4

| ADDRESS INPUT SIGNAL | | OUTPUT SIGNAL OF PAGE DECDER | | | | | | | |
|---|---|---|---|---|---|---|---|---|---|
| AD1 | AD0 | PS0T | PS1T | PS2T | PS3T | PS0T | PS1T | PS2T | PS3T |
| L | L | H | L | L | L | L | L | H | H |
| L | H | L | H | L | L | H | L | L | H |
| H | L | L | L | H | L | H | H | L | H |
| H | H | L | L | L | H | H | H | H | L |

Fig. 8

| ACCESS MODE | | ADDRESS INPUT SIGNAL | | | SENSE AMPLIFIER CONTROL SIGNAL | | STATES OF SENSE AMPLIFIER CIRCUIT | | | | | |
|---|---|---|---|---|---|---|---|---|---|---|---|---|
| MODE | AREA | AD1 | AD0 | | SAEBF | SAEBL | SAF | SAL0 | SAL1 | SAL2 | SAL3 | |
| STANDBY | tA1, tA4 | H/L | H/L | | H | H | × | × | × | × | × | |
| NORMAL | tA2 | L | L | | L | L | ○ | ○ | ○ | ○ | ○ | |
| | | L | H | | L | L | ○ | ○ | ○ | ○ | ○ | |
| | | H | L | | L | L | ○ | ○ | ○ | ○ | ○ | |
| | | H | H | | L | L | ○ | ○ | ○ | ○ | ○ | |
| PAGE | tA3 | H/L | H/L | | H | H | × | × | × | × | × | |

Fig. 10

| ACCESS MODE | | ADDRESS INPUT SIGNAL | | SENSE AMPLIFIER CONTROL SIGNAL | | | | | | STATES OF SENSE AMPLIFIER CIRCUIT | | | | | |
|---|---|---|---|---|---|---|---|---|---|---|---|---|---|---|---|
| MODE | AREA | AD1 | AD0 | SAEB F | SAEB L0 | SAEB L1 | SAEB L2 | SAEB L3 | | SAF | SAL0 | SAL1 | SAL2 | SAL3 | |
| STANDBY: tA1, tA4 | | H/L | H/L | H | H | H | H | H | | × | × | × | × | × | |
| NORMAL | tA2 | L | L | L | L | H | H | H | | ○ | × | ○ | ○ | ○ | |
| | | L | H | H | H | L | H | H | | ○ | ○ | × | ○ | ○ | |
| | | H | L | H | H | H | L | H | | ○ | ○ | ○ | × | ○ | |
| | | H | H | H | H | H | H | L | | ○ | ○ | ○ | ○ | × | |
| PAGE | tA3 | H/L | H/L | H | H | H | H | H | | × | × | × | × | × | |

6,061,297

SEMICONDUCTOR MEMORY DEVICE

BACKGROUND OF THE INVENTION

1. Field of the Invention

The invention relates to a semiconductor memory device such as ROM (read only memory).

This application is based on Patent Application No. Hei 09-204907 filed in Japan, the content of which is incorporated herein by reference.

2. Background Art

Conventionally, in this type of general semiconductor memory devices, a high speed reading means for reading data at specified addresses is provided, in which the reading is carried out by transition of addresses of data for a page decoder after reading a plurality of data in a memory cell matrix and transferred to a sense-amplifier circuit in parallel. Thus, a high speed reading operation is performed by transition of data addresses in a page access mode.

FIG. 11 is a block diagram showing a structure of a conventional four bit semiconductor memory device comprising a page access mode, as an example of ROM (read only memory) having the page access mode.

As shown in this figure, the conventional ROM is provided with an address buffer circuit 100, a CE buffer circuit 101, a memory cell matrix 107, an X-decoder 103, a Y-decoder 104, a Y-selector, a sense amplifier circuit 110, a page decoder 102, a sense amplifier selection circuit 150, and an output-buffer 113.

The address buffer circuit 100 receives address input signals ADo-ADn from the outside, and the CE buffer circuit 101 receives a control signal CE from the outside. The memory cell matrix 107 stores and holds memory data. The X-decoder 103 selects data along a word line direction of the memory cell matrix 107. The Y-decoder 104 and the Y-selector 108 select data along a digit line direction. The sense amplifier 110 reads and senses data information stored in the memory cell matrix 107, after pre-charging the digit line of the selected memory cell matrix 107 with an output control signal CEB of the CE buffer circuit 101.

The page decoder circuit 102 receives output address signals for the page access mode as an input signal and selects signals outputted from a plurality of sense amplifier circuits 110. The sense-amplifier selection circuit 150 selects output signals of the sense amplifier circuits 110 selected by the page-decoder circuit 102 and outputs selected signals. The output buffer 113 outputs data outputted from the selection circuit 150 to an output terminal 114.

Hereinafter a reading operation of a conventional memory device having four bits and having the page access mode is described.

In general, there are two types of read modes such as a normal access mode and a page access mode in reading functions of a semiconductor memory device having the page access mode, and an access function for reading data by rapidly switching the addresses is called a page access mode function.

First, the normal access mode is described.

The data reading operation using the normal access mode is performed by the following steps. After setting address input signals AD0 to ADn and a control signal CE from the outside into active states (active when the CEB signal is L), data in the 4 bit memory-cell-matrix are then read to four sense amplifier circuits 110, SA0 to SA3, in parallel, and one bit data selected using page addresses AD0 to ADn is then outputted. The first access time necessary in the normal access mode is designated as tACC or tCE.

Next, the page access mode is described.

The data reading operation using the page access mode is performed by the following steps. After the reading operation using the normal access mode is completed, by switching only page addresses AD0 and AD1, both output signals PSm (m=0, 1, 2, 3) of the page decoder 102 and output signals SAoutm (m=0, 1, 2, 3) of the sense amplifier circuits 110 which are selected by the page selection circuit 150 are processed through the output buffers 113, and data OUTn (n=0, 1, 2–n) are outputted to the output terminals 114. Since, in this case, the data reading operation is performed after data have been transferred and determined in the sense amplifier circuits, high speed reading is attained. The second access time necessary for reading using the page access mode is designated as tPAC. In general, the access time of tPAC is far faster than the access time using the normal access mode and it is possible to realize the access time tPAC in a range of ½ or ⅓ of that of tACC or tCE.

As described hereinbefore, in the conventional read circuit having a reading circuit using the page access mode, by activating a plurality of sense amplifier circuits, only the output signals SAoutm of the sense amplifier circuits 110 selected by the page selection circuit 150 are outputted to the output terminals 114 as data OUTn (n=0, 1, 2–n) by the aid of the later output buffer 113. Since it is necessary to maintain the output signals SAoutm of the sense amplifier circuits 110, which are not selected by the page selection circuit 150, in the standby state until they are transformed into the selection state, the current consumption in the sense amplifier circuits is large.

Here, a current waveform flowing in the sense amplifier circuits 110 is shown as ISA and ISAA in FIG. 12. ISA represents a current waveform for an access time corresponding to one sense amplifier 110, and ISAA represents a current waveform for an access time corresponding to one output. In conventional devices, since the device comprises sense amplifier circuits 110 having the same current capacity as that of the four bits page access mode, the relationship between ISA and ISAA is expressed as ISAA=4*(ISA), and ISAA is simply 4 times larger than ISA. Furthermore, the current waveform flowing in the sense amplifier circuits differs depending upon access modes, and, in general, there are three types of access modes. Current waveforms of sense amplifier circuits in different access modes will be described hereinafter.

The first access mode is a standby mode shown in the region tA1 and tA4 in FIG. 12, the second access mode is a normal access mode shown in the region of tA2, and the third access mode is a page access mode shown in the region of tA3. The regions tA1 and tA4 of the first timing are standby modes, and, in this case, a logic construction is provided such that a electric current does not flow.

The tA2 region of the second timing is the region of normal access mode. In this region, all of the sense amplifier circuits 110 are made active, and a pre-charging operation starts on a digit line selected by the Y-decoder 104 in the memory matrix 107 and the Y-selector 108, and a large electric current, which increases toward a peak current I1, flows in the sense amplifier circuits 110 in a partial region AI1 until the pre-charging operation is completed. A sum total of the electric current flowing within the partial region of AI1 corresponds to the quantity of electric charge of the digit line. Furthermore, a steady current I2 flows, since the active state is maintained after the pre-charging operation of the digit-line is completed. If the higher reading speeds tACC or tCE in the normal access mode are desired, they may be made possible by rise of the pre-charging capacity of the sense amplifier circuits 110. However, the rise in the pre-charging capacity accompanies an increase in the peak current I1 and the steady current I2 proportional to the data-reading speed tACC or tCE.

The tA3 region of the third timing is the region of a page access mode. Although no switching takes place in this region, the steady current I2 flows, since it is necessary to maintain the output signals of the sense amplifier circuits SAoutm in the standby state.

Hereinbefore, a description is given on currents flowing in one sense amplifier circuit 110 for each access mode. Total current ISAT flowing in all sense amplifier circuits can be expressed as;

$$ISAT=ISA*m*n$$

where, ISA is a current value flowing in a sense amplifier circuit, m is the page number of the sense amplifier circuit, and n is the number of outputted data. The number of the sense amplifier circuit is m*n. Therefore, by increasing the page number of the sense amplifier circuits m or the number of outputted data n, the peak current Ipmax and the steady current Ismax of the current ISAT flowing in the sense amplifier circuits 110 increase. Therefore, due to increases in the peak current Ipmax and the steady current Ismax, a fluctuation level of the power-source potential VCC and the ground potential GND increases. Moreover, recently, there is a tendency to increase the numbers of the page m and output data n to improve the function of memory devices.

Hereinbefore, a measure for controlling the page access mode operation of a conventional device which does not provide any means against increases of the peak and steady current was described as a first example of conventional methods. Other conventional control measures provided with means against increases in current are disclosed in Japanese Patent Application, First Publication No. Hei 8-55470 and Japanese Patent Application, First Publication No. Hei 7-211077. These measures will be described hereinafter, with brief comparison with the above first conventional measure, as the second and third conventional measures.

The second conventional measure disclosed in Japanese Patent Application, First Publication No. Hei 8-55470 is intended to reduce the current consumption by switching the driving capacity of a feedback-type inverter circuit in a biasing circuit, depending upon the access mode.

FIG. 13 is a block diagram illustrating a structure of a semiconductor memory device having, for example, a four bit page mode, as the second conventional example of ROMs comprising the page access mode. The difference between the first and second memory devices is in that the second memory device comprises two types of inverter circuit (circuit diagrams are not shown) having different driving capacities in the feedback inverter circuit in the biasing circuit for amplifying the potential of the digit line in the sense amplifier circuits 110, and that the driving capacity is controlled by switching the driving capacity of the sense amplifier circuits depending upon the access mode using a sense amplifier control circuit 106 provided between the address buffer circuit 100 and the sense amplifier circuits 110.

In this second structure, since a high speed reading is necessary when the reading is performed using the normal access mode, a feedback type inverter circuit with a high driving capacity is selected in the biasing circuit; and since high speed reading is not necessary when reading is performed using the page access mode, a feedback type inverter circuit with a small driving capacity in the biasing circuit is selected for amplifying the potential of the digit line of the sense amplifier circuits.

Next, timing waveforms are explained hereinafter referring to FIG. 14.

The differences between the waveforms of the second conventional example and the first conventional example are in the finishing time tSAPL of the pre-charging operation of data SAoutL read from the sense amplifier circuits 110 (region for the pre-charge operation is AI2), and in the peak current I1' and the stationary current I2' of the current waveform ISAL (shown by a dotted line). The finishing time tSAPL can be set in a range up to the cycle time tA2 of the normal access mode, because it is sufficient for the pre-charging operation to finish before the page decoder signal PSm is determined by the page access mode.

Consequently, the current ISAPL flowing in the sense amplifier circuits 110 during the normal access mode can be expressed as follows. Assuming that AI1 is a pre-charging operation region to pre-charge data SAoutF read from the sense amplifier circuits 110 using the normal access mode and that ISAF is a current waveform, and since the amount of the electric charge of each digit line is equal, the total sums of currents in both regions of AI1 and AI2 are identical, and the waveform ISAL is related with ISAF as AI1<AI2, both peak currents I1' and the steady current I2' becomes small, and the reduced amounts of the peak current ΔI1 and steady current ΔI2 can be expressed as, ΔI1=I1–I1' and ΔI2=I2—I2'.

Therefore, the maximum value of the peak current in the current waveform Ipmax is expressed as, Ipmax=I2+3*I2'. When comparing this to the first conventional method, the reduced value of the peak current Ipmax in ISAA, ΔIpmax, and the reduced value of the steady current Ismax, ΔIsmax, are expressed as, ΔIpmax=3*ΔI1, and ΔIsmax=3*Ismax. The above relationships clearly shows that the structure of the second device is constructed with a reduced current load.

Next, a third conventional example is described referring to the disclosure of Japanese Patent Application, First Publication No. Hei 7-211977. It is not necessary for the third conventional example to always activate the sense amplifier circuits, and since output signals from the sense amplifier circuits are determined at the time of normal access mode, sense amplifier circuits are controlled to convert into the non-active state after being latched by the latch circuit, so that the current consumption can be reduced.

FIG. 15 illustrates a constitution of a semiconductor memory device comprising a 4 bits page mode as the third example of conventional ROMs.

The third example differs from the first example in various points. That is, it comprises an address transition detector 105 (hereinafter, called as ATD) which detects transition of an output signal ao of the address buffer circuit 100 and outputs an one-shot-pulse signal at, and a sense amplifier control circuit 106 which receives the input signal of the one-shot-pulse signal at outputted from the ATD 105 and outputs a sense-amplifier control signal SAEB for controlling the activation/inactivation of the sense amplifier circuits 110 and a latch control signal LAEB for controlling the latch circuit 112. The sense amplifier control circuit 106 comprises a logic construction such that it is possible to control activation/inactivation of the sense amplifier circuits depending on the access mode.

Hereinafter, the third device will be explained referring to the timing waveform diagram shown in FIG. 16.

The third example differs from the first example in the timing of activation of the sense amplifier circuits 110. In the first conventional example, when the output signal CEB of the CE buffer circuit 101, which receives a control signal CE from outside, is in L-level, the sense amplifier circuits 110 are always activated during both the normal access mode (tA2 region) and the page access mode operations (tA3 region), and the sense amplifier circuits 110 are inactivated only when the output signal CEB of the CE buffer circuit is in the H-level (tA1 and tA4 regions). In contrast, in this third conventional example, a sense-amplifier control signal SAEB and a latch control signal LAED are outputted by the ATD 105 and the sense-amplifier control circuits 106 are activated such that only the area in the memory cell matrix for determine the reading data (in this case, L-level is the activated state). In access modes other than the normal access mode (in tA1, tA3, and tA4 regions), the sense-amplifier control signal SAEB and the latch control signal LAEB inactivate all sense amplifier circuits.

As hereinabove described, in the third conventional example comprising the page access mode, the operation of the sense amplifier circuits 110 in the normal access mode is the same as that of the first example, but after the sense-amplifier output signals SAoutm are determined, the circuit is maintained in the standby state, which results in a reduction of current consumption.

The current waveforms which flow in the sense amplifier circuits 110 are shown as ISA and ISAA in FIG. 16. ISA indicates a waveform corresponding to an access time of one sense amplifier 110, and ISAA corresponds to a total access time of one output. Since this convention example, similar to the first conventional example, is formed with the sense amplifier circuits having an identical capacity with that of the 4 bits page access mode, the relationship between ISA and ISAA can be expressed as, ISAA=4*(I SA), that is, ISAA is 4 times larger than ISA, and the waveforms ISAA and ISA are the same in the region tSAPF', where the sense amplifier circuits 110 are in the active state. However, the current does not flow in the sense amplifier circuits 110 in regions where the sense amplifier circuits 110 are not activated, after passing the activated region tSAPF'. Therefore, it is possible to further reduce the current consumption, compared with the first and second conventional examples.

Now, in the conventional semiconductor memory device having the page access function, since the sense amplifier circuits are activated simultaneously, the slope of current required to reach a high peak current becomes steep, and the level of fluctuation of the source potential VCC and the ground potential GND becomes large, which results in that the noise margin being deteriorated and the operational speed of the sense-amplifier circuits being reduced. This tendency becomes remarkable when the number of page and the number of bit increases.

A measure for this high peak current is shown in, for example, Japanese Patent Application, First Publication No. Hei 8-55470, which discloses a type of the sense-amplifier control circuit which switches and controls the driving capacity of the bias feedback circuit for amplifying the potential of the digit line in the sense amplifier circuits. Japanese Patent Application, First Publication No. Hei 7-211077 discloses another type of sense-amplifier control circuit which controls inactivation of the sense amplifier circuits when the reading is carried out using the page access mode. However, the above measures are not sufficient to solve the problem associated with the high peak current.

SUMMARY OF THE INVENTION

Therefore, it is the object of the present invention to provide a semiconductor memory device which is capable of suppressing the peak current when operating sense-amplifier circuits using the normal access mode, and which is also capable of realizing high speed access during the reading time.

In order to reduce the peak current and to realize the high speed access in the normal access mode in which the activated operation is necessary for the sense amplifier, the present invention provides a semiconductor memory device comprising two types of sense amplifier circuits with different current capacities, wherein a different activation times for two types of sense amplifier circuits is set by a delay line which transforms the one-shot-pulse signal generated by the ATD into optional widths, such that the routes for transmitting data read from the memory cell matrix using the page decoder circuit, sense amplifier, and the latch selector using the normal access mode and the page access mode are selected, and wherein the device is provided with a sense-amplifier control circuit for controlling times of activation of the sense amplifier circuits.

According to the present constitution, when reading data stored in the memory cell matrix, the sense amplifier circuits having the page access function, select a sense amplifier circuit having an early activation start time and a large current capacity at the time of normal access mode operation, and selects another sense amplifier circuit having a late activation start time and a small current capacity at the time of page access mode operation. That is, in the normal access mode operation, a sense amplifier provided with an early activation start time and a large current capacity is selected, and at the time of the page access mode operation, a sense amplifier provided with a late activation start time and a small current capacity is selected. In the normal access mode operation, since it is necessary to carry out high speed pre-charging operation of the digit line which senses data, a sense amplifier circuit is selected with an early activation start time and with a large current capacity. In contrast, since it is not necessary to perform high speed pre-charging of the digit line at the time of the page access mode operation, a sense amplifier is selected with a late activation start time and a small current capacity.

When the reading is performed using the normal access mode, two types of sense amplifier circuits with different current capacities and different activation times are activated, and after the reading is completed and the read data are latched by the latching circuits, the sense amplifier circuits are inactivated subsequently.

Therefore, according to the semiconductor memory device of the present invention, the peak current and the current consumption can be controlled by activating the optimum sense amplifier circuits for the access mode. It is also possible to secure the noise margin, and a high speed operation of the sense amplifier is attained by suppressing the fluctuation level of the poeer source potential VCC and the ground potential GND.

BRIEF DESCRIPTION OF THE DRAWINGS

The present invention will be explained in more detail by descriptions of the following embodiments of the present invention with reference to the following drawings.

FIG. 3 is a graph to explain the operation of the sense amplifier portion of the semiconductor memory device according to the first embodiment of the present invention.

FIG. 4 is a graph to explain the operation of the sense amplifier portion of the semiconductor memory device according to the first embodiment of the present invention.

FIG. 8 is a graph to explain the operation of the sense amplifier of the semiconductor device according to the second embodiment of the present invention.

FIG. 10 is a graph to explain the operation of the sense amplifier portion of the semiconductor device according to the third embodiment of the present invention.

DETAILED DESCRIPTION OF PREFERRED EMBODIMENTS

Figure 1:
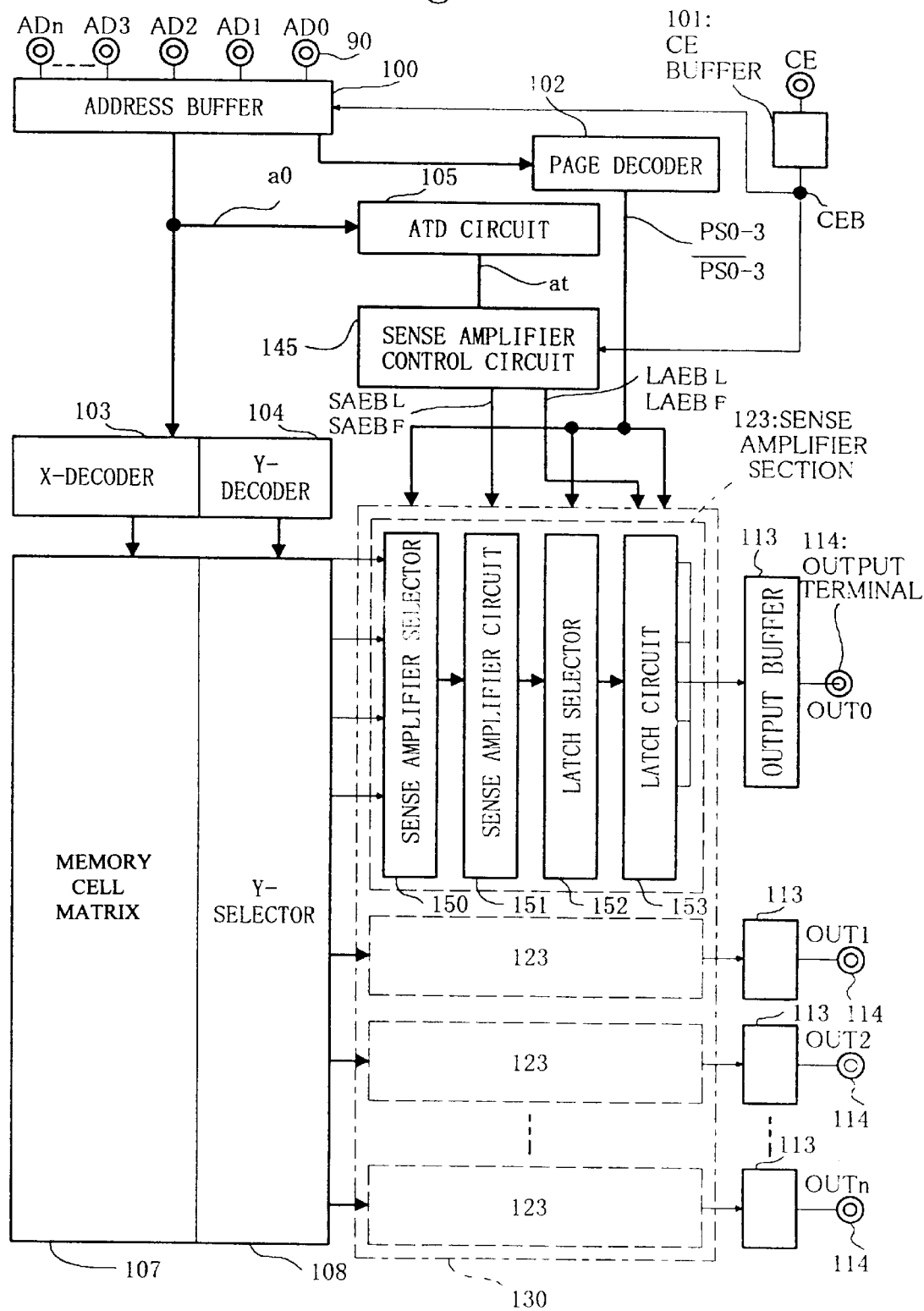
FIG. 1 is a block diagram showing the first embodiment of the semiconductor memory device of the present invention.

Hereinafter, preferred embodiments of the present invention will be described referring to the attached drawings.
(I) First Embodiment FIG. 1 is a block diagram showing reading circuits provided with, for example, the four bit page mode, as an example of ROM having a page access mode according to the first embodiment of the present invention.

As shown, the ROM of this embodiment comprises an address buffer circuit 100, a CE buffer circuit 101, a memory cell matrix 107, an X-decoder 103, a Y-decoder 104, a Y-selector 108, an ATD (address transition detector) 105, a sense-amplifier control circuit 145, a sense amplifier selection circuit 150, a sense amplifier circuit 151, a latch selector 152, a latch circuit 153, and an output buffer 113.

The address buffer circuit 100 receives address input signals AD0 to ADn from the outside and the CE buffer circuit 101 receives a control signal CE from the outside. The memory cell matrix 107 stores and hold memory data. The X-decoder 103 selects a line of data along a word-line direction. The Y-decoder 104 and the Y-selector 108 select a line of data along the digit line direction. The ATD 105 detects transition of an output signal ao from the address buffer circuit 100 and output a one-shot-pulse signal at.

The sense amplifier control circuit 145 receives the one-shot-pulse signal as an input signal and outputs sense amplifier circuit signals SAEB which has two different timings for controlling the activation/inactivation of the sense amplifier circuits and a latch control signal LAEB for controlling the latch circuit 153 to the sense amplifier circuits 151 having two different capacities. The sense-amplifier selecting circuit 150 selects one type of sense amplifier 151 among two-types of sense amplifiers having two different capacities, for transmitting the digit signals from the memory-cell matrix selected by the Y-selector 108.

The sense amplifier circuits 151 have two different capacities for sensing the data read from the memory cell matrix 107 after a pre-charging operation of the selected digit line of the memory cell matrix 107 with the output control signal SAEB of the sense amplifier control signal 145. The latch selector 152 selects a output signal of the sense amplifier circuits having two different capacities.

The latch circuit 153 latches the signals outputted from the latch selector 152 by the latch control signal LAEB for controlling the output signal of the sense-amplifier control circuit 145, and receives output signals of address information for the page access mode operation as the input data, and outputs signals selected by the output signals of the page decoder 102 for page selection to output data from the subsequent output buffer 113. The output buffer 113 output read-out data to the outside through the output terminals 114. The above sense-amplifier selection circuit 150, the sense amplifier circuits 151, the latch selector 152, and the latch circuits constitute a sense amplifier circuit section 123.

Figure 2:
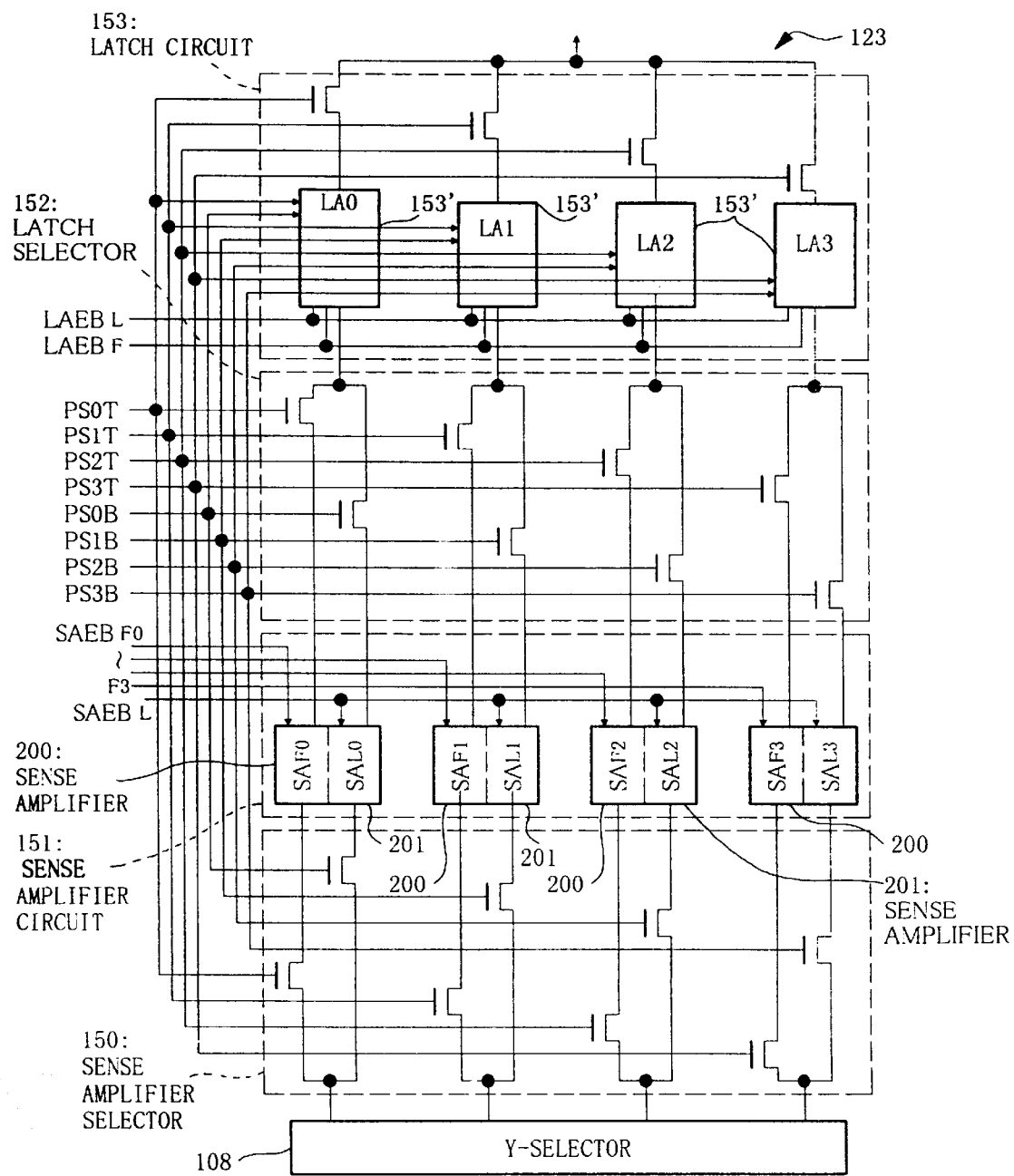
FIG. 2 shows a detailed construction of the sense amplifier portion of the semiconductor memory device according to the first embodiment of the present invention.

FIG. 2 shows a detailed construction of the sense amplifier circuit section 123 corresponding to one output in the block diagram shown in FIG. 1.

As shown in FIG. 2, the sense amplifier circuit 151 comprises four sense amplifiers 200 (SAF0–SAF3) each having a large current capacity and being compatible with a requirement for a high speed operation and four sense amplifiers 201 (SAL0–SAL3) each having a low current capacity but not required for a high speed operation. Activation/inactivation of these sense amplifier circuits 200 and 201 having different current capacities, and activation and inactivation of both sense amplifiers 200 and 201 having different current capacities are controlled by output signals SAEBF0–3 and SAEBL of the sense-amplifier control circuits 145 (see FIG. 1).

Hereinafter, an operation of the sense amplifier circuit section 123 is described. The sense amplifier circuit section 123 is provided with a logic construction such that the output signals SAEBF0–3 and SAEBL outputted from the sense-amplifier control circuit 145 for controlling two types of sense amplifier circuits 200 and 201 activate sense amplifiers 200 and 201 only during the normal access mode operation, and, the sense amplifier control circuit 145 further output signals for advancing or delaying the activation start time and the activation finish time as well as for altering a time-width of the activation term. Therefore, sense amplifiers are not activated except in the normal access mode operation (stand-by mode and page access mode).

FIG. 3 shows the sense amplifier control signals (a sense amplifier circuits are activated by a L-level signal) in each access mode and the operational state of each sense amplifier circuit. As shown in this figure, all of four sense amplifier 201 (SAL0–3) each having a small current capacity are commonly activated (○ indicates an activated state, and X indicates an inactivated state) during the normal access mode, because output signals of the sense amplifier control circuits 145 are commonly inputted into the sense amplifier circuits 201.

However, the sense-amplifier control circuit 145 is provided with a logic construction such that only one among four sense amplifier 200 each having a large current capacity (SAF0–3) is activated, and the other three remain in a non-activated state, because the output signals of the sense amplifier control circuits 145 are independently directed to each sense amplifier 200.

Furthermore, a logic construction is provided, in both standby mode and page access mode, such that output signals SAEBF0–3 of the sense-amplifier control circuits 145 are fixed in the H-level irrespective of levels of the address input signals; thus, all of two types of sense amplifier circuits 200 and 201 are maintained at the non-active state during the standby mode and the page access mode.

FIG. 4 illustrates output signals of the page decoder 102 which are to be inputted into the sense amplifier selection circuit 150 and the latch selector 152 for selecting a transmission route in 2 types of sense amplifier 200 and 201 with different current capacities. The page decoder 102 comprises a logic circuit based on the table of the truth value shown in this table.

Figure 5:
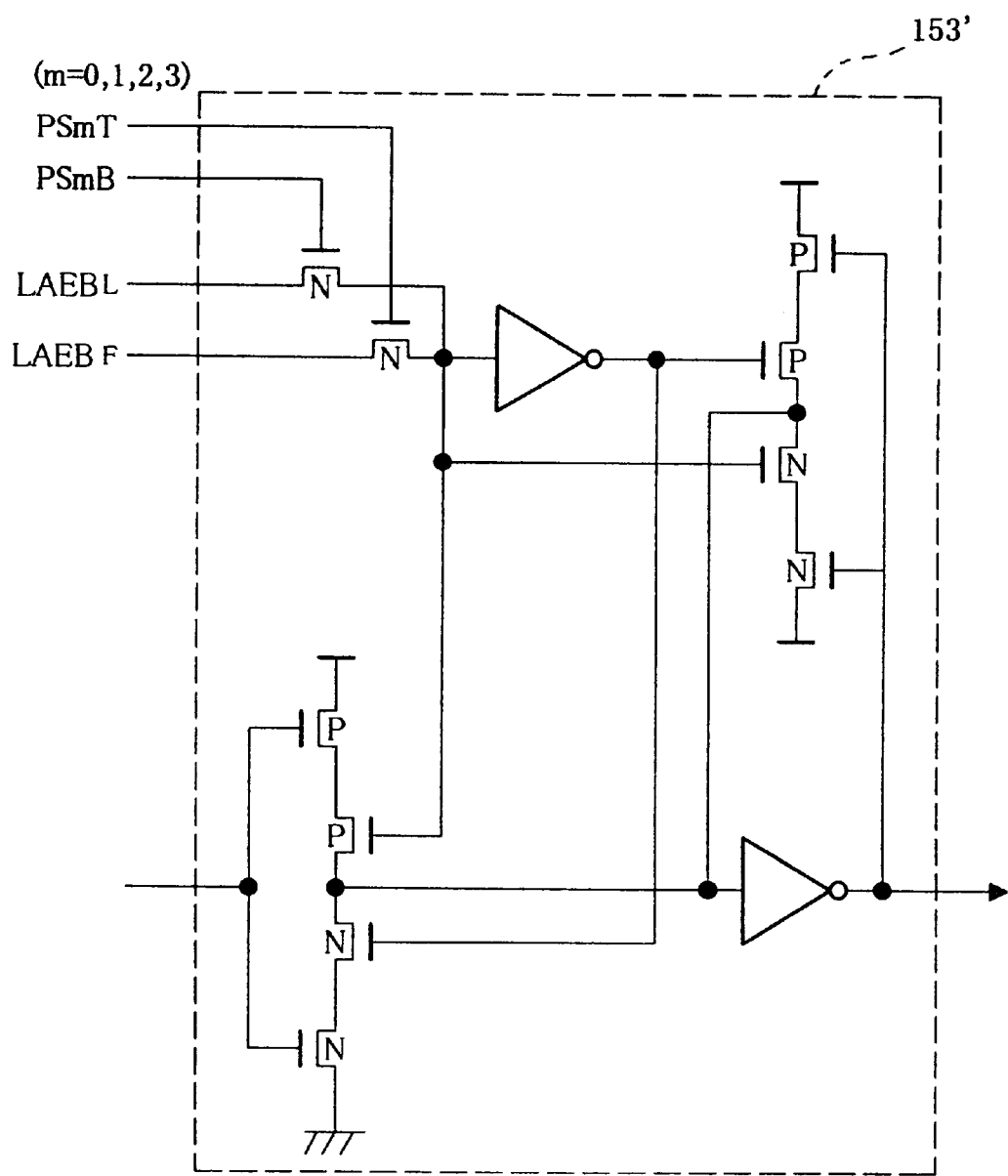
FIG. 5 is a graph showing the latch circuit of the sense amplifier portion of the semiconductor memory device according to the first embodiment of the present invention.

Moreover, the present system is constructed such that output signals from the latch selector 152 are inputted into a latch circuit 153', which is controlled by either one of two latch signals LAEBF and LAEBL generated by the sense-amplifier control circuit 145. Either one of two latch signals is selected by output signals PSmT and PSmB (m=0, 1, 2, 3), and data selected by the page decoder 102 is outputted from the latch circuit 153'. FIG. 5 shows an example of the practical latch circuits which realize the above logic construction.

Figure 6:
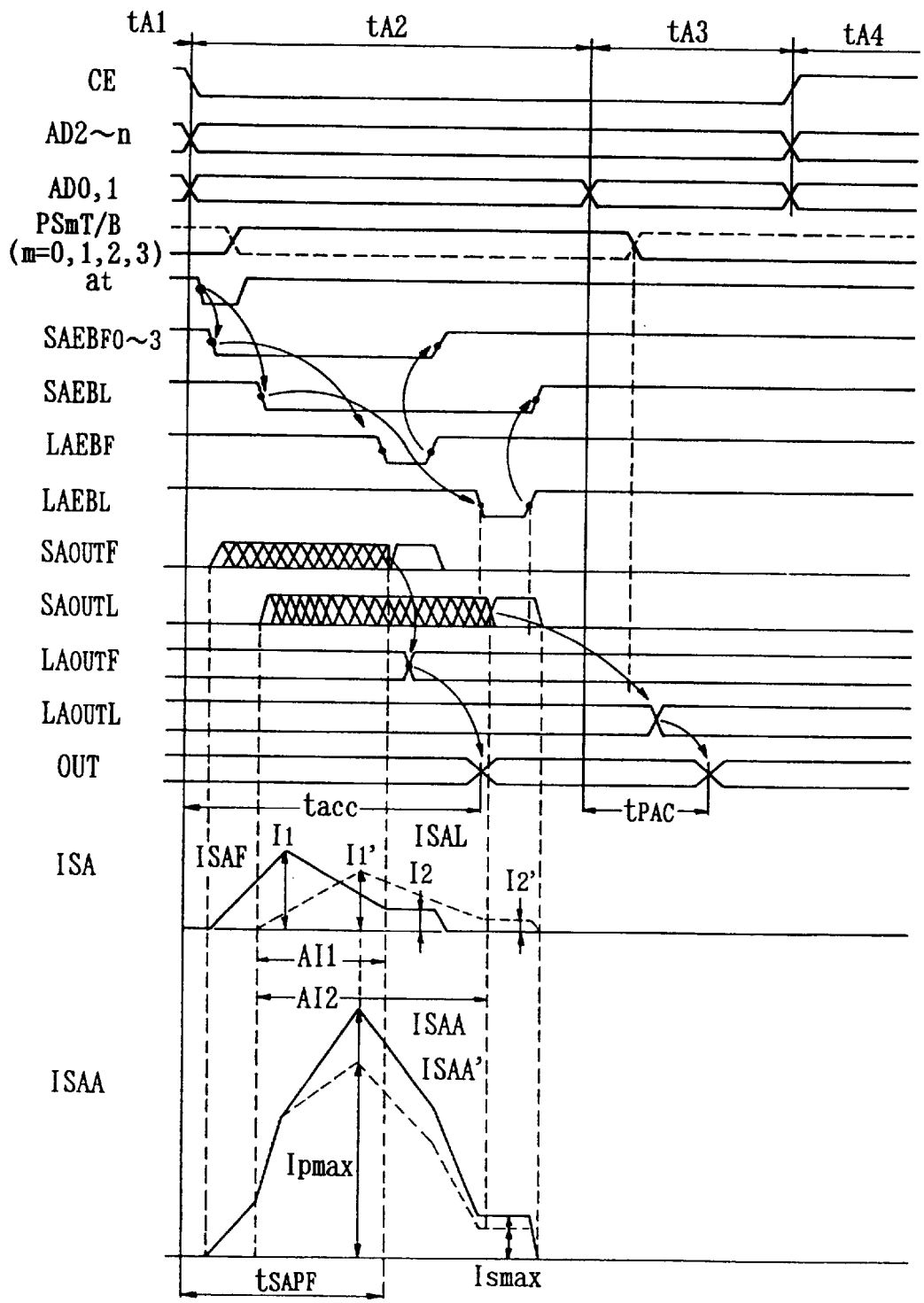
FIG. 6 is a graph of the waveform showing the operation of the semiconductor memory device according to the first embodiment.

Next, the reading operation of the four bits page access mode will be described referring to a waveform diagram illustrated in FIG. 6.

There are two points which distinguish the present method from the conventional methods described hereinbefore. The first point is present in the method of controlling the sense amplifier circuits by switching and controlling the driving capacity of the bias feedback circuit for amplifying the potential of the digit line in the sense amplifier circuits, and the second point is present in the method of controlling the activation timing of sense amplifier circuits 151.

That is, the present device differs from the conventional devices in that the sense amplifier circuit 151 of the present invention comprises two types of sense amplifiers 200 and 201 having different current capacities, and that the sense amplifier circuit 151 generates two types of sense amplifier control signals for activating either one of two types of sense amplifiers 200 and 201 having different current capacities.

The present device is characterized in that, in the normal access mode (tA2 region), the ATD 105, which outputs an one-shot pulse signal at when detecting transition of the output signal ao of the address buffer circuit 100, advances the activation start time of the sense amplifier earlier, since it is necessary for the sense amplifier to read at high speed in the normal access mode. Furthermore, the present device is also characterized in that signals SAEBFm (m=0, 1, 2, 3) are set to inactivate the sense amplifiers rapidly in order to reduce the current consumption, after data are determined and these data are latched by latching signals LAEBF. It should be noted that the sense amplifiers each having a large current capacity are selected in this case.

The preferable features of the present device are also present in that, since it is not necessary for the sense amplifiers to operate at high speed read in the page access mode operation, the activation start time of the sense amplifier circuits is delayed, and, further, the sense-amplifier control signal SAEBL and the latch control signal LAEBL are set to delay the activation time of the sense amplifier circuits, as long as the access speed in the page access mode operation does not exceed the access speed tPAC in the page access mode operation, and in that the sense amplifier circuits with small current capacities are selected in the page access mode operation.

Hereinafter, a current waveform ISA which represents a current flowing in one sense-amplifier is described.

At first, the waveform ISAF (waveform shown by a solid line) is described when data are read from the memory cell matrix in the normal access mode operation and obtained data are outputted to the outside.

In the case when data are read from the memory cell matrix in normal access mode, since a sense amplifiers 200 capable of high speed processing and a control signal SAEBFm (m=0, 1, 2, 3) having an early activation start time are selected, a large current towards the peak current I1 flows, because pre-charging of the digit line takes place simultaneously with the activation of the sense amplifier circuits 200.

The peak current I1 is proportional to the pre-charging speed AI1 of the digit line, and if the pre-charging speed is made higher, then the peak current becomes higher. Furthermore, after the pre-charging operation of the digit line is completed, then a steady current I2 flows, and, after being latched by the latch circuit 153', the current flow ceases accompanied by inactivation.

Next, the waveform ISAL (shown by a dotted line) is described, in which data are read from the memory cell matrix using the page access mode operation and the obtained data are outputted to the outside.

In the case when data are read from the memory cell matrix using the page access mode, it is not necessary to operate at high speed, and therefore the sense amplifiers 201 having small current capacities and the control signal SAEBL having a late activation start time is selected. Thus, a current toward the peak current I1' starts flowing, because the pre-charging operation of the digit line (an area hatched by diagonal lines in the sense-amplifier output signal SAoutL) starts simultaneously with the activation of the sense amplifiers 201. The peak current value I1' is smaller than the peak current I1, that is, I1>I1', since, in this case, the pre-charging operation to the digit line is carried out by the sense amplifiers 201 having a smaller current capacity than the sense-amplifiers 200 having larger current capacities.

After the pre-charging operation is completed, the steady current I2' flows and, after being latched by the latch circuit 153, then the current flow ceases accompanied by the inactivation of sense amplifiers 201. This steady current I2' is smaller than the steady current I2, that is I2>I2', since, in this case, the pre-charging operation is carried out by sense-amplifiers 201 having smaller current capacities.

The total sums (area) of currents flowing in the two-types of sense-amplifiers 200 and 201 having different current capacities in respective pre-charging areas AI1 and AI2 are the same because the quantity of the electrical charge of each selected digit line is the same.

The current waveforms ISAA represent a current flowing in sense-amplifiers corresponding to one output, and this waveform ISAA is a total sum of a current ISAF flowing in one sense-amplifier 200 and the total of currents ISAL flowing in the four sense amplifiers 201. The current waveform ISAA for one output of the present invention differs from that of conventional devices in that it takes 2 to 3 times longer for the present waveform to reach the peak Ipmax, when compared with the conventional waveform. That is, the present invention is designed such that the slope of the current, $\Delta$ISAA, per unit time $\Delta$t (that is, $\Delta$ISAA/$\Delta$t) is about ½ to ⅓ compared with that of the conventional device. That is, the slope of current ΔISAA per unit time Δt (that is, ΔISAA/Δt) can be reduced by optimizing the activation timing of sense-amplifiers and the current capacity of the sense-amplifiers.

(II) Second Embodiment

Figure 7:
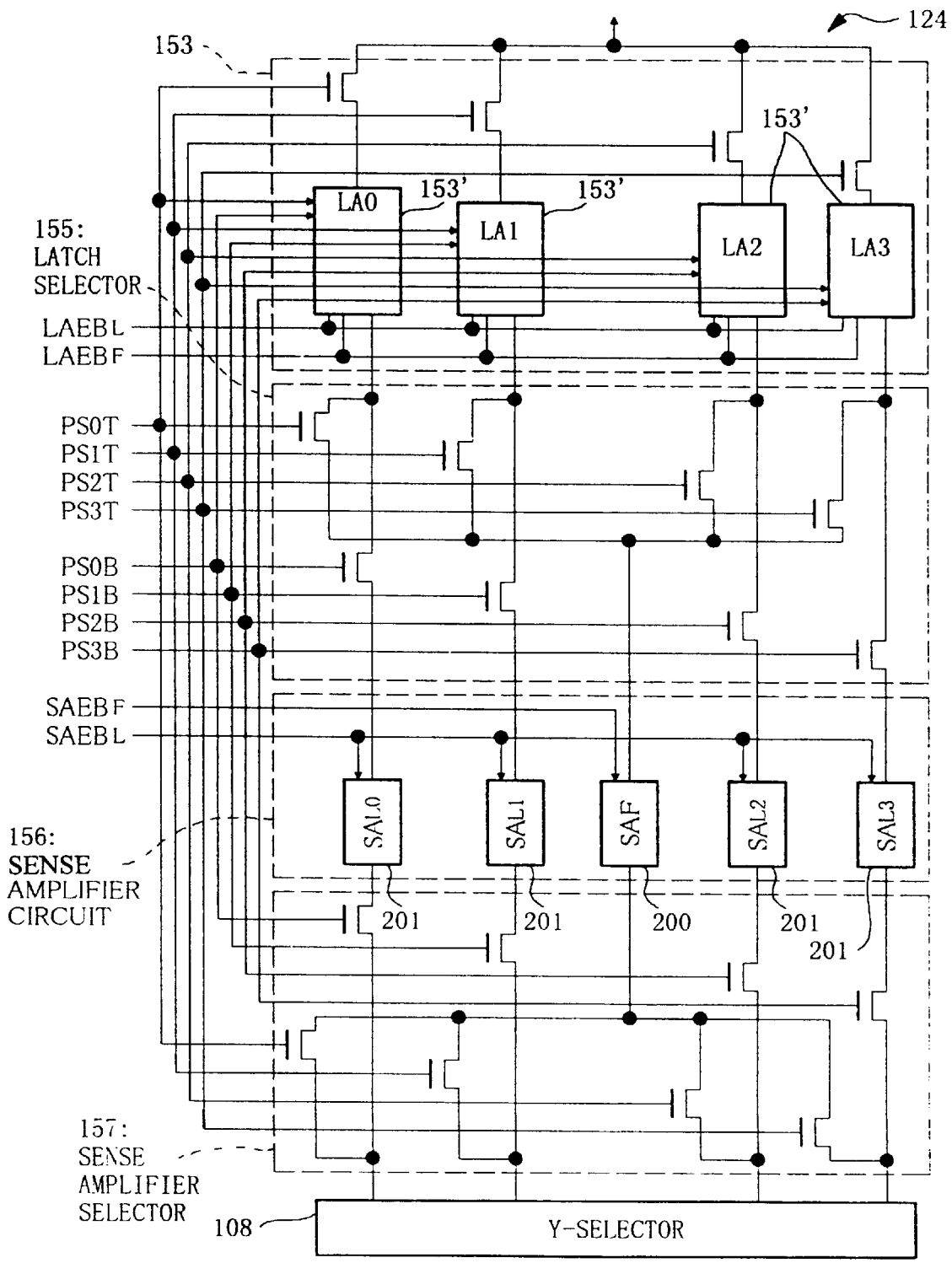
FIG. 7 shows the detailed construction of the sense amplifier portion of the semiconductor memory device according to the second embodiment of the present invention.

FIG. 7 illustrates a circuit of the second embodiment of the present invention, showing the detailed structure of a sense amplifier section 124 corresponding to one output shown in a block diagram of FIG. 1.

The above first embodiment comprises four pieces of sense amplifiers 200 having large current capacities used for high speed processing and four sense amplifiers 201 having low current capacities used for non-high speed processing, wherein the activation/inactivation of each of said sense amplifiers 200 and 201 is controlled by output signals SAEBF0–3 and SAEBL of the sense-amplifier control circuit 145. At the time when the sense-amplifiers are activated, five sense-amplifiers are activated which comprise one sense-amplifier 200 having a large current capacity and four sense-amplifiers 201 having a low current capacities.

In contrast, the system according to the second embodiment is constructed by a structure comprising one sense-amplifier 200 having a large current capacity (SAF) and four sense-amplifiers 201 having a low current capacities (SAL0–SAL3), wherein activation/inactivation of these five sense-amplifiers 200 and 201 are controlled by output signals SAEBF and SAEBL of the sense amplifier control circuit 145, and the system according to the second embodiment is controlled, when in the activated state, similar to the case of the first embodiment, such that these five sense-amplifiers are activated comprising one sense-amplifier 200 having a large current capacity and four sense-amplifiers 201 having low current capacities.

FIG. 8 shows a table indicating types of signals generated by the sense amplifier control circuit (sense amplifier is activated by L-level signal) in respective access modes and the activation/non-activation states of respective sense-amplifiers. As shown in FIG. 8, since a logic construction is provided to suspend electric current from flowing at the time of the standby mode and the page access mode, output signals SAEBF and SAEBL are fixed at the H-level, irrespective of the levels of address input signals AD0 and AD1, two types of sense-amplifiers having different current capacities are maintained at non-activated states, similar to the first embodiment.

However, according to the second embodiment, in the normal access mode operation, when compared with the first embodiment, a logic construction is provided intending to reduce the chip-size of the semiconductor memory device, so as to be able to conduct operations using one sense amplifier 200 having a large current capacity and four sense amplifiers having low current capacities, and also using one signal for controlling the sense amplifier 200 other than control signals for four sense amplifiers 201 having low current densities, which means that the number of the sense amplifier 200 and control signals for the sense amplifiers 200 are reduced from 4 to 1. This is realized by a sense amplifier selector 157 and a latch selector 155 which unify the output and input routes of data read by the sense-amplifier 200. The operation of this case is the same as that of the first embodiment, so that the explanation is omitted.

(III) Third Embodiment

Figure 9:
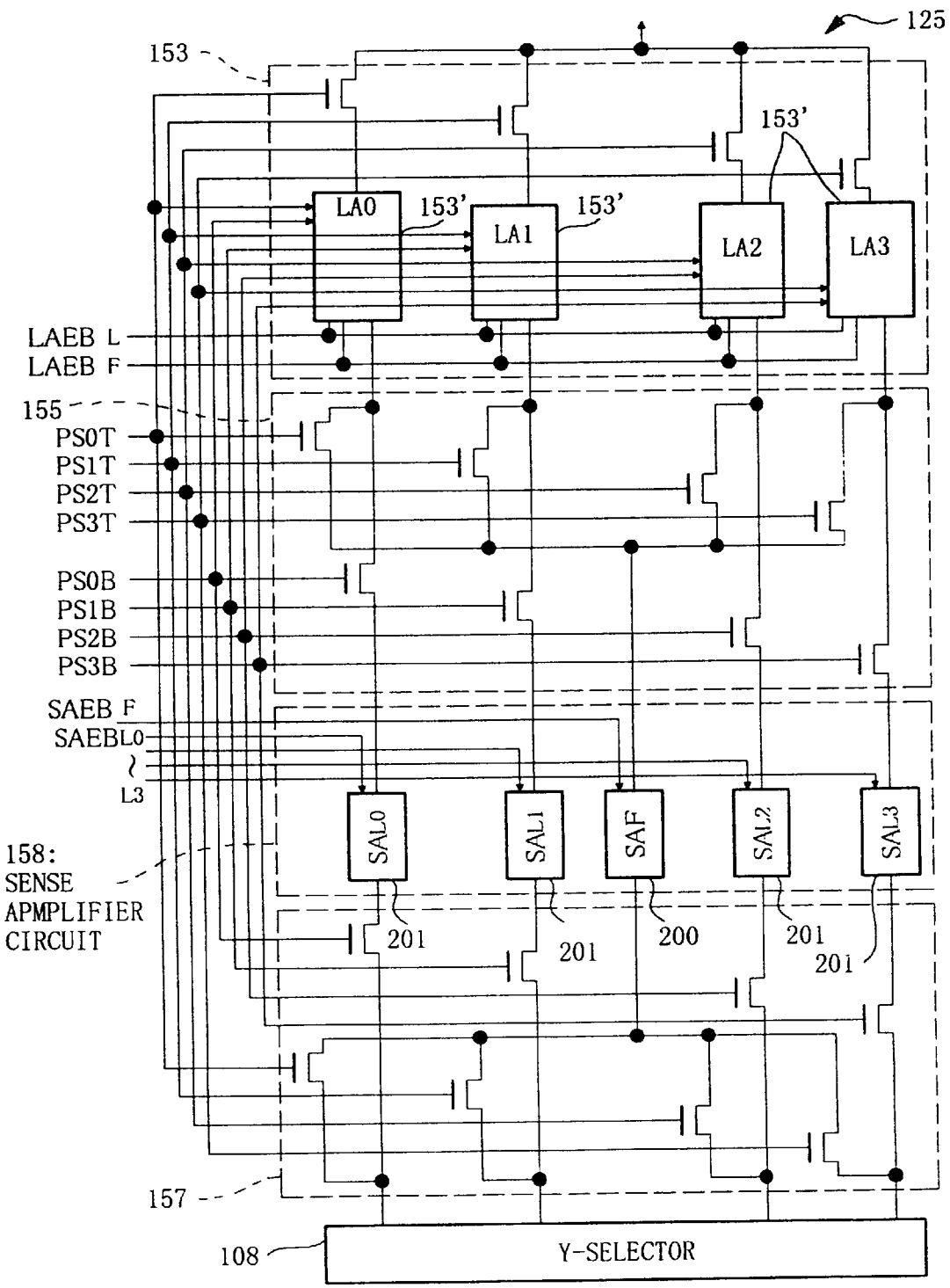
FIG. 9 shows the detailed construction of the sense amplifier of the semiconductor memory device according to the third embodiment of the present invention.
Figure 11:
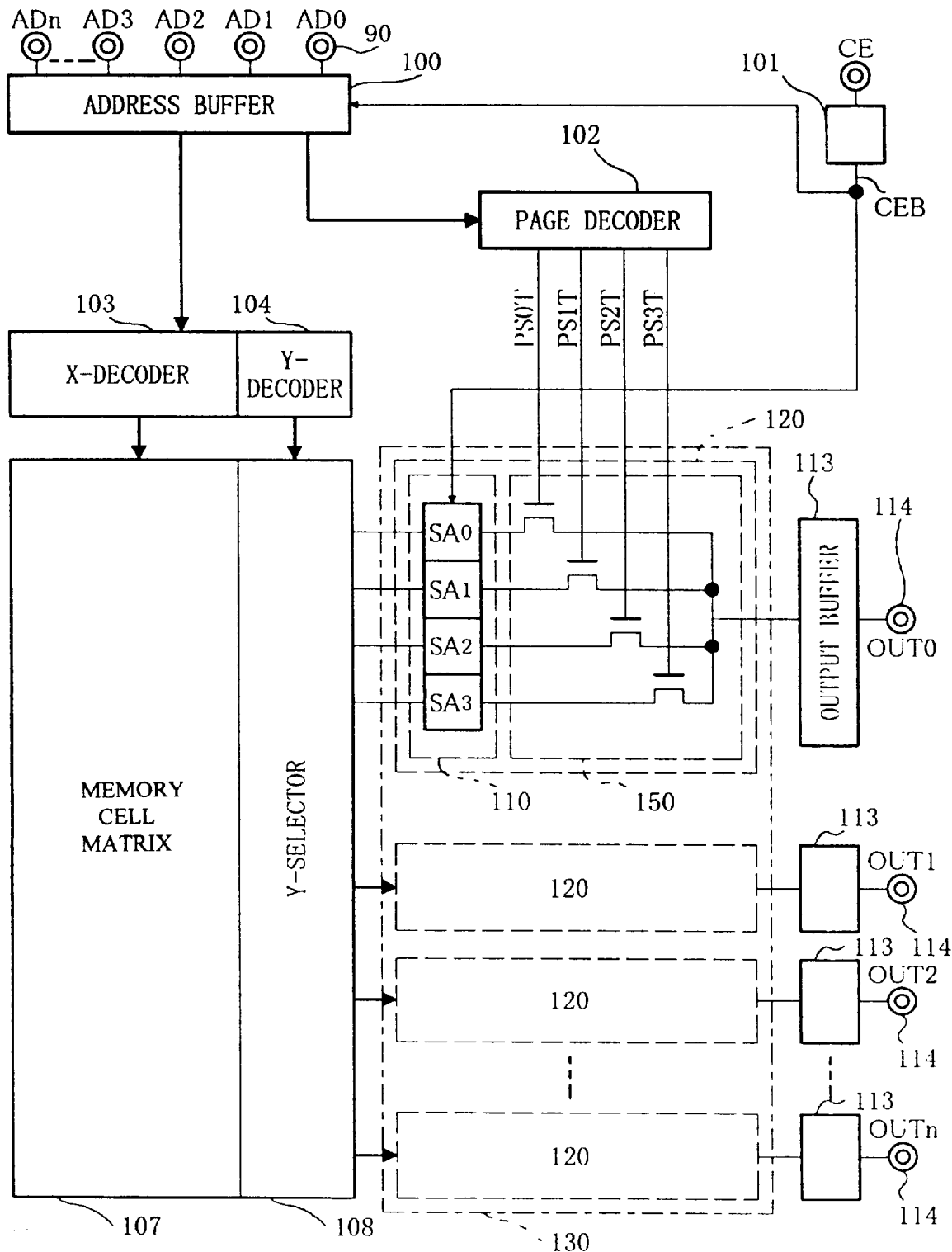
FIG. 11 is a graph showing a construction of a conventional semiconductor memory device.
Figure 12:
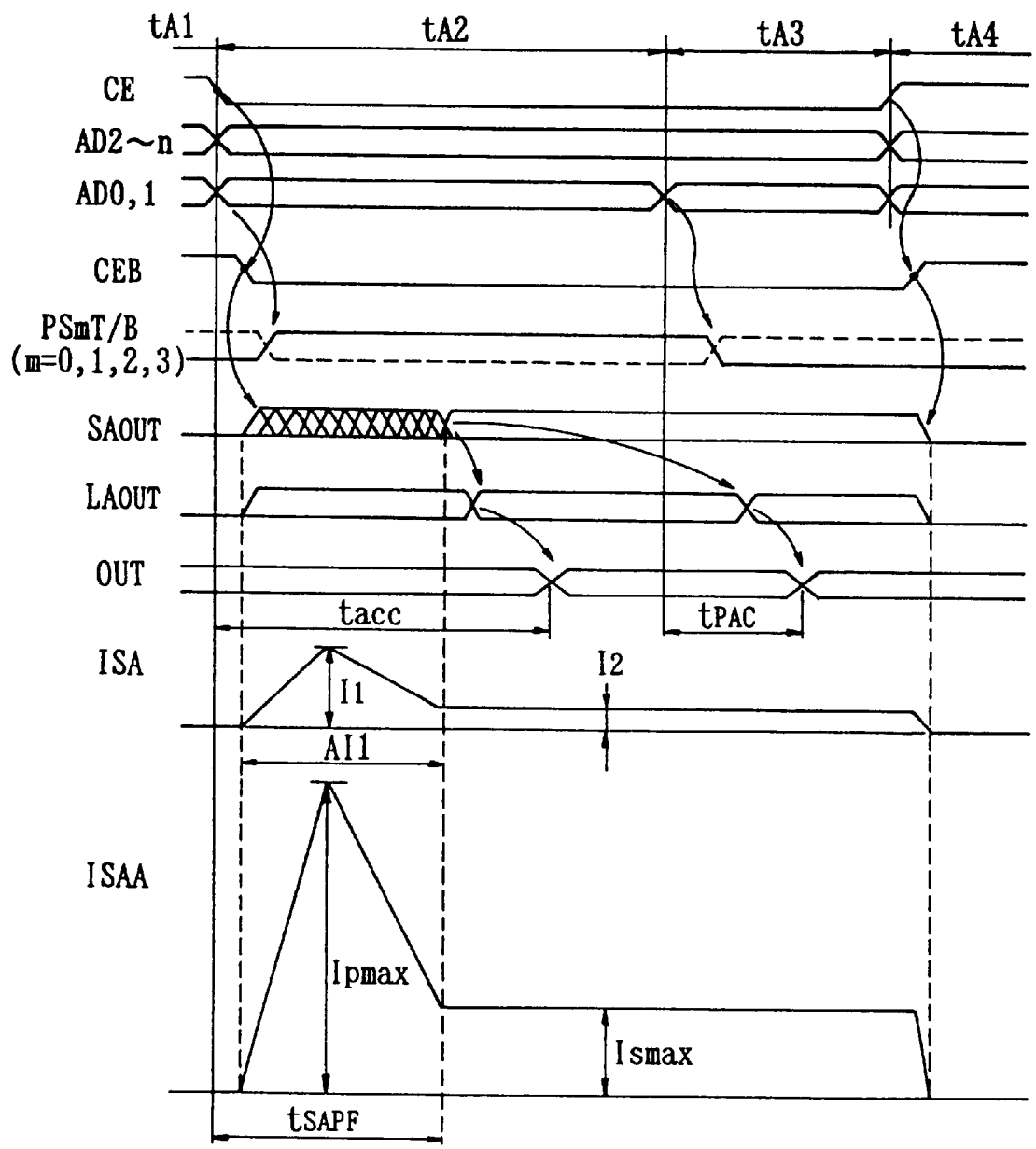
FIG. 12 is a graph of the timing waveform showing a operation of the conventional semiconductor memory device illustrated in FIG. 11.
Figure 13:
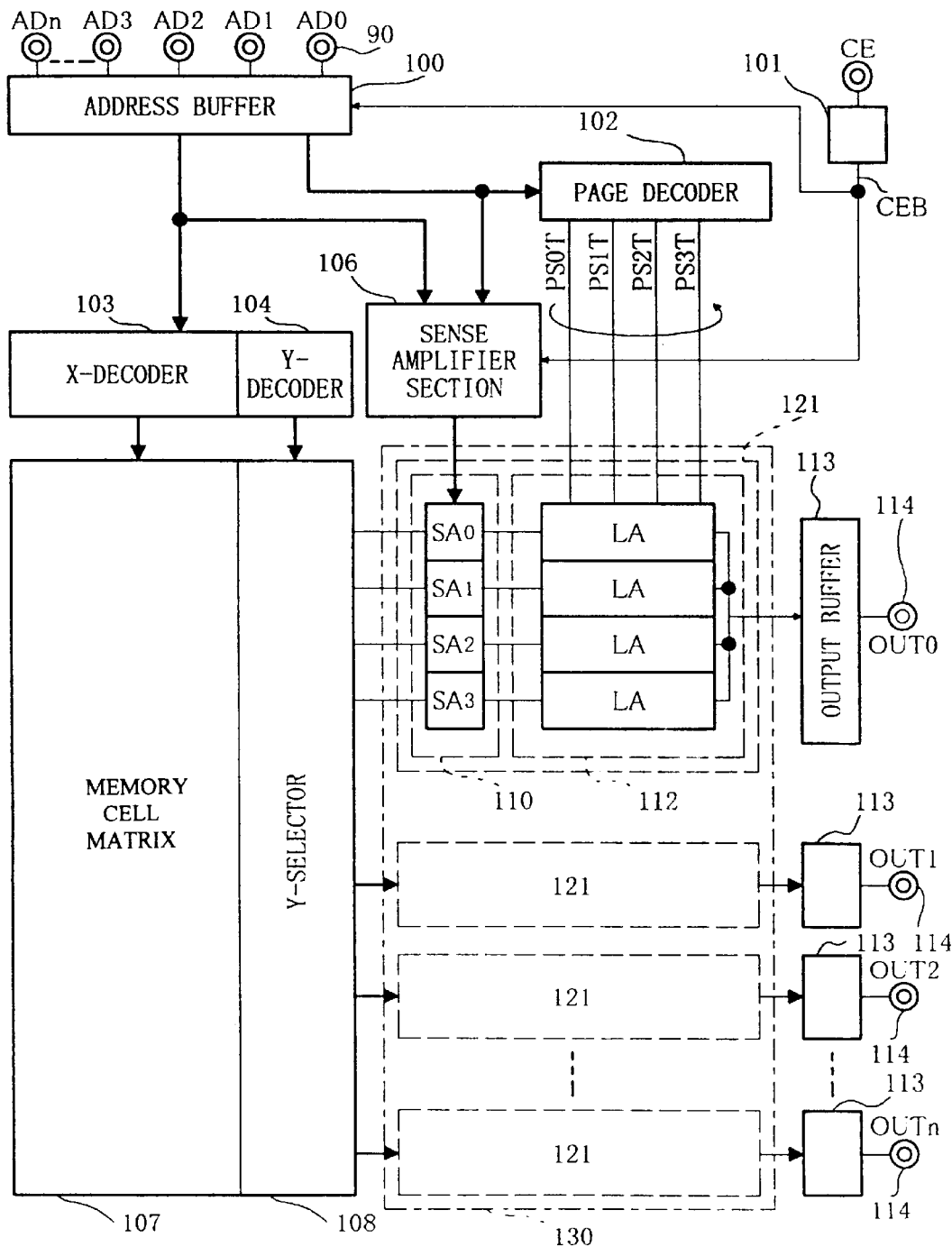
FIG. 13 is a block diagram showing a construction of a conventional semiconductor memory device.
Figure 14:
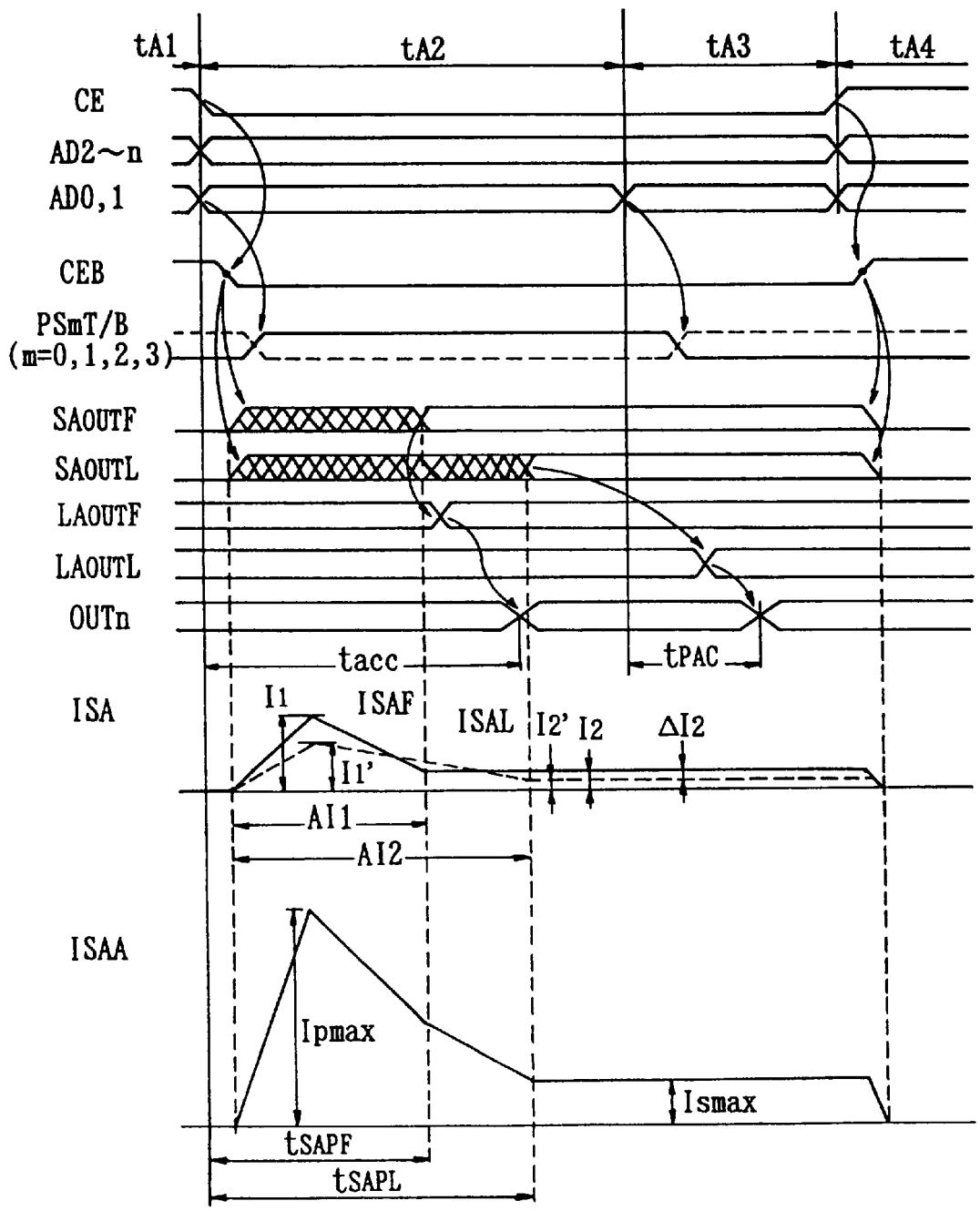
FIG. 14 is a timing waveform showing the operation of the conventional semiconductor memory device illustrated in FIG. 13.
Figure 15:
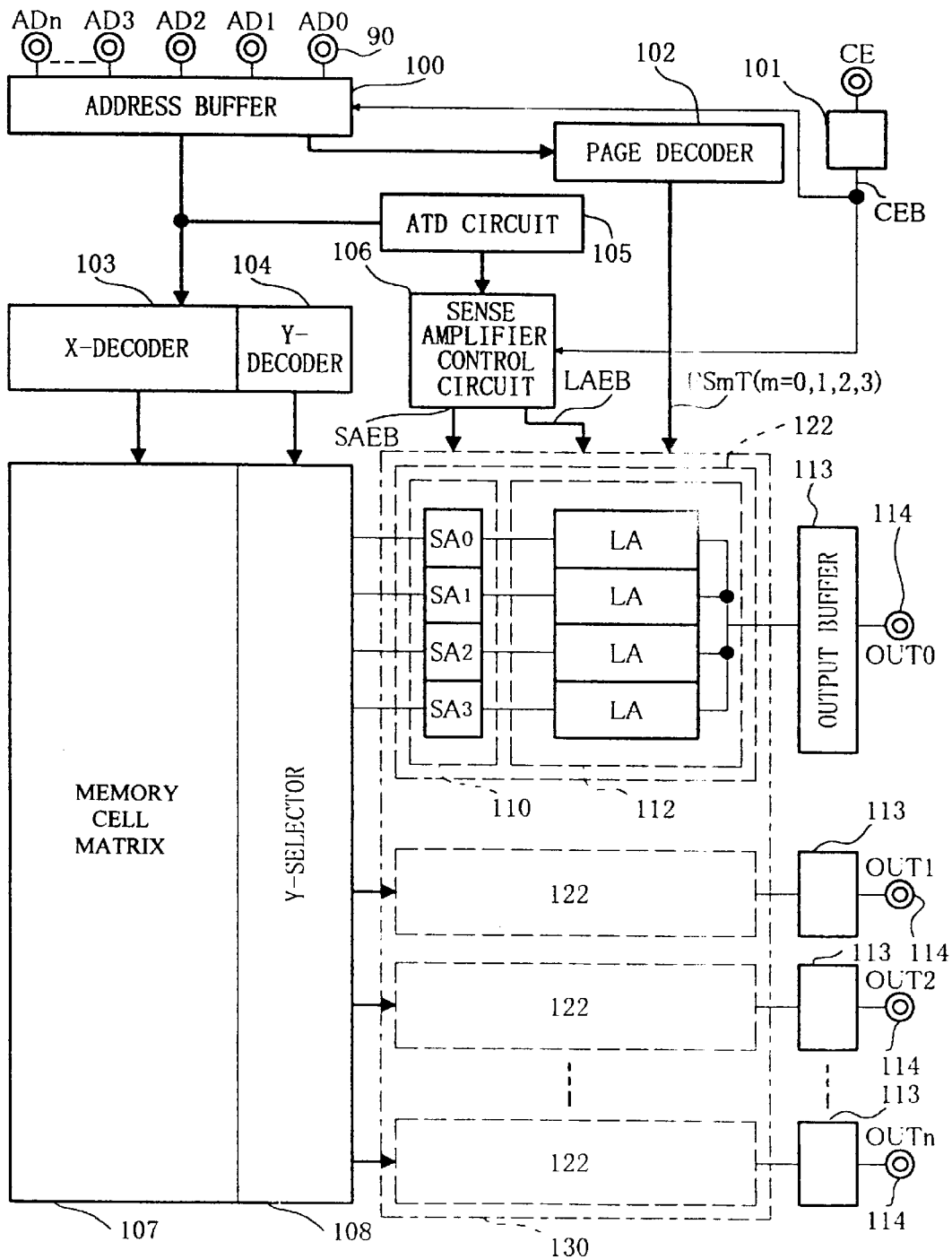
FIG. 15 is a block diagram showing a construction of a conventional semiconductor memory device.
Figure 16:
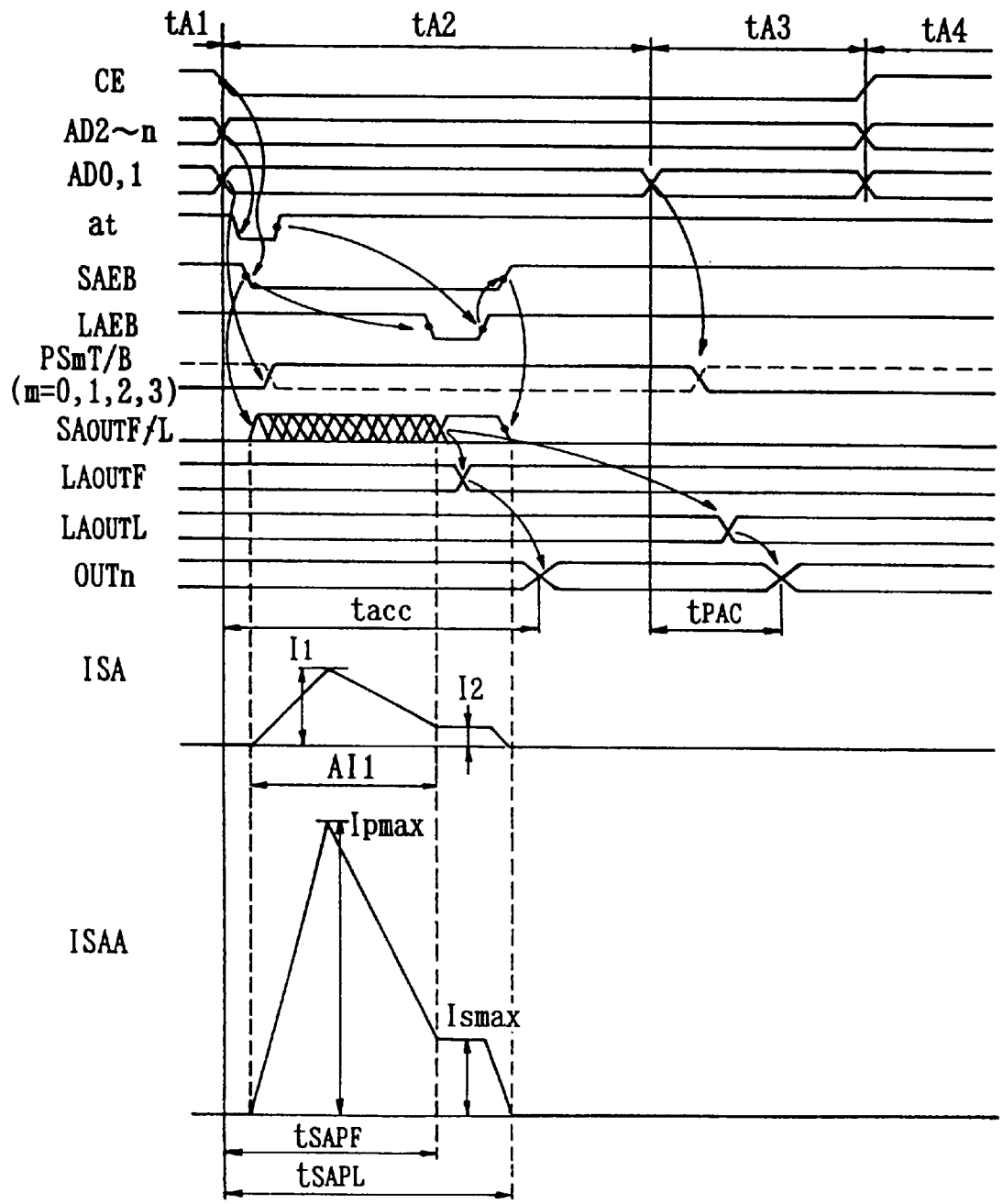
FIG. 16 is a timing waveform showing the operation of the conventional semiconductor memory device shown in FIG. 15.

FIG. 9 illustrates the third embodiment of the present invention, showing a detailed constitution of a circuit which corresponds to one output of the sense-amplifier section in the block diagram of FIG. 1.

In the first and second embodiments of the present invention, 5 sense-amplifiers in total, including one sense-amplifier 200 with a large current capacity and four sense-amplifiers 201 with low current capacities, are operated. However, although the circuit construction is the same as that of the second embodiment, in the third embodiment of the present invention, the circuit construction is formed such that output signals SAEBL0–3 are independently inputted into three sense-amplifiers 201 with low current capacities.

FIG. 10 shows types of control signals of the sense-amplifier control circuit in each access mode and the activation/inactivation state of respective sense-amplifiers.

As shown in this figure, among four sense amplifiers activated in the normal access mode operation (○ represents an activated state, and X represents a non-activated state), since output signals SAEBL0–3 of the sense-amplifier control circuit 145 are independently inputted into sense-amplifiers 201 (SAL–SAL 3), one sense-amplifier which is read in the normal access mode is in the non-activated state, and other three sense-amplifiers are in the activated state.

The sense-amplifier 200 (SAF) having a large current capacity is always activated by the output signal SAEBF of the sense-amplifier control circuit 145. Thus, the operation is carried out by four sense-amplifiers in total, including one sense-amplifier 200 having a large current capacity and three sense-amplifiers 201 having a small current capacities, thereby, reduction of the peak current is attained by reducing a current corresponding to one sense amplifier 201 with a small current capacity.

In the case of operations in the standby mode and the page access mode, since a logic construction is provided such that output signals SAEBF and SAEB0–3 of the sense-amplifier control circuit 145 fix at H-level, irrespective of the address input signals AD0 and AD1, similar to the first and second embodiments, all of two types of sense-amplifiers 200 and 201 with different current capacities are maintained at the non-activated state. The current waveform of this case is shown by a dotted line in FIG. 6, which clearly indicates that a part of the peak current is reduced which corresponds to one sense-amplifier 201, when compared with the waveform ISAA shown by the solid line obtained by the first and second embodiments.

The semiconductor memory device of the present invention is capable of being set such that the slope of the partial current ΔISAA per unit time Δt (that is, ΔISAA/Δt) is reduced as a whole to ½ or ⅓ of the conventional value by optimizing the activation timing of the sense-amplifier and its current capacity at the normal access mode, so that it is possible to control the peak current, the slope of the current toward the peak, and the current consumption. Consequently, the fluctuation level of the source potential and the ground potential can be suppressed which makes it possible to secure the margin for noise and realize the high speed access in the sense amplifier operation.

What is claimed is:

1. A semiconductor memory device provided with a page access mode comprising:
   a plurality of memory cells;
   a Y-selector for selecting one or more digit lines among a plurality of digit lines;
   a plurality of sense-amplifiers for amplifying data read via said Y-selector;
   a selector for selecting one sense-amplifier among said plurality of sense-amplifiers and transmitting data from said one sense-amplifier to an output buffer; and
   a control circuit for controlling said plurality of sense-amplifier and said selector;

wherein said device further comprises:
- a sense amplifier used in a normal access mode operation, which is different in dimension from said plurality of sense-amplifiers for sensing data read in the normal access mode operation; and
- a sense amplifier used in the page access mode operation for sensing data read in the page access mode operation;
- wherein said control circuit performs switching to activate said sense amplifiers in the normal access mode operation.

2. A semiconductor memory device according to claim 1, wherein the driving capacity of said normal access sense-amplifier for sensing data read in the normal access mode operation is set at a high level.

3. A semiconductor memory device according to claim 1, wherein the driving capacity of said page access sense-amplifier for sensing data read in the page access mode operation is set at a low level.

4. A semiconductor memory device according to claim 1, wherein said device further comprises said sense-amplifiers for the page access mode operation, the number of which is the same as that of the sense amplifiers for the normal access mode operation provided with the same number of the page number; and a sense amplifier selector, wherein said control circuit selects and activates sense-amplifiers to be activated in the normal access mode operation.

5. A semiconductor memory device according to claim 1, wherein said device further comprises one sense-amplifier for the normal access mode operation, sense-amplifiers for the page access mode operation, the number of which is the same as the page number, and a sense amplifier selector, wherein said control circuit selects and switches sense-amplifiers to be activated in the normal access mode operation.

6. A semiconductor memory device according to claim 1, wherein, after the sensed data are determined by starting the normal access mode operation, said control circuit controls for selecting a latch circuit among a plurality of latch circuits by a decoder circuit and by the selector and transmits data to an output buffer.

7. A semiconductor memory device according to claim 4, wherein said control circuit activates only sense-amplifiers selected among sense amplifiers for the normal access mode operation and among sense-amplifiers for the page access mode operation.

8. A semiconductor memory device according to claim 1, wherein said control circuit shifts an activation start time of the sense-amplifiers for the normal access mode operation from that of the sense-amplifiers for the page access mode operation.

9. A semiconductor memory device according to claim 1, wherein said control circuit shifts an activation finish time of the sense-amplifiers for the normal access mode operation from that of the sense-amplifiers for the page access mode operation.

10. A semiconductor memory device according to claim 1, wherein said control circuit sets the activation finish time within the page access mode operation, as long as a page access speed is not reduced.

11. A semiconductor memory device according to claim 1, wherein said control circuit controls and selects said latch circuits by judging whether data are for sense-amplifiers for the normal access mode operation or for sense-amplifiers for the page access mode operation.

12. A semiconductor memory device comprising:
- a first-type sense amplifier circuit with a first current capacity;
- a second-type sense amplifier circuit with a second current capacity, wherein said second current capacity is different from said first current capacity; and
- a sense amplifier control circuit for selectively activating said first-type sense amplifier circuit and said second-type sense amplifier circuit, wherein a first activation time for said first-type sense amplifier and a second activation time for said second-type sense amplifier are controlled by said sense amplifier control circuit,
- wherein said first-type sense amplifier is selected in a first mode-type of operation and said second-type sense amplifier is selected in a second mode-type of operation,
- wherein said first mode-type of operation comprises a normal access mode operation and said second mode type of operation comprises a page access mode operation.

13. The semiconductor memory device as claimed in claim 12, wherein subsequent to a reading operation being performed using said first mode-type of operation, said first-type sense amplifier and said second-type sense amplifier circuits are inactivated.

14. The semiconductor memory device as claimed in claim 12, wherein said device includes one said first-type sense amplifier circuit and four of said second-type sense amplifier circuit.

15. The semiconductor memory device as claimed in claim 12, wherein said device includes one said first-type sense amplifier circuit and three of said second-type sense amplifier circuit.

16. The semiconductor memory device as claimed in claim 12, wherein said device includes one said first-type sense amplifier circuit and four of said second-type sense amplifier circuit.

17. The semiconductor memory device as claimed in claim 12, wherein said device includes one said first-type sense amplifier circuit and three of said second-type sense amplifier circuit.

18. A semiconductor memory device provided with a page access mode comprising:
- a plurality of sense-amplifiers for sensing data read in a normal access mode operation;
- a control circuit for controlling said plurality of sense-amplifiers;
- a sense-amplifier used in the normal access mode operation, which is different in dimension from said plurality of sense-amplifiers for sensing data read in the normal access mode operation; and
- a sense-amplifier used in the page access mode operation for sensing data read in the page access mode operation,
- wherein said control circuit performs switching to activate said sense-amplifiers in the normal access mode operation.

* * * * *